United States Patent [19]

Rottner

[11] Patent Number: 5,710,059
[45] Date of Patent: Jan. 20, 1998

[54] METHOD FOR PRODUCING A SEMICONDUCTOR DEVICE HAVING A SEMICONDUCTOR LAYER OF SIC BY IMPLANTING

[75] Inventor: Kurt Rottner, Kista, Sweden

[73] Assignee: ABB Research Ltd., Zurich, Switzerland

[21] Appl. No.: 636,942

[22] Filed: Apr. 24, 1996

[51] Int. Cl.$^6$ .................................................. H01L 21/22
[52] U.S. Cl. ........................ 437/151; 437/100; 437/933
[58] Field of Search ........................ 437/30, 100, 149, 437/150, 151, 933, 934; 148/DIG. 148, DIG. 151

[56] References Cited

U.S. PATENT DOCUMENTS

| | | | |
|---|---|---|---|
| 5,030,580 | 7/1991 | Furukawa et al. | 437/100 |
| 5,170,231 | 12/1992 | Fujii et al. | 437/100 |
| 5,318,915 | 6/1994 | Baliga et al. | 437/151 |

OTHER PUBLICATIONS

"High Transconductance β–SiC Buried–Gate JFET's", HFPC May 1989 Proceedings, pp. 95–102.
"High–Transconductance β–SiC Buried–Gate JFET's", IEEE Transactions on Electron Devices, vol. 36, No. 6, Jun. 1989, pp. 1045–1049.
"Characteristics of Inversion–Channel and Buried–Channel MOS Devices in 6H–SiC", IEEE Transactions on Electron Devices, vol. 41, No. 7, Jul. 1994, pp. 1257–1264.

*Primary Examiner*—Chandra Chaudhari
*Attorney, Agent, or Firm*—Pollock, Vande Sande & Priddy

[57] ABSTRACT

A method for producing a semiconductor device comprises a step of implanting first conductivity type impurity dopants of at least two different elements in a semiconductor layer being doped according to a second opposite conductivity type, and after that anneal the semiconductor layer at such a high temperature that one of said elements is diffusing slowly into the semiconductor layer and the other is diffusing rapidly thereinto.

14 Claims, 1 Drawing Sheet

METHOD FOR PRODUCING A SEMICONDUCTOR DEVICE HAVING A SEMICONDUCTOR LAYER OF SIC BY IMPLANTING

TECHNICAL FIELD OF THE INVENTION AND PRIOR ART

The present invention relates to a method for producing a semiconductor device having a semiconductor layer of SiC with at least a pn-junction therein, comprising a step a) of implanting an impurity dopant of a first conductivity type, being one of a) n and b) p, into said semiconductor layer being doped according to a second opposite conductivity type for forming a first type doped near surface layer in said semiconductor layer and a step b) of annealing said semiconductor layer at a high temperature for making the implanted impurity dopants electrically active, as well as a semiconductor device produced by carrying out such a method.

Such an ion implantation technique may be used for production of all types of semiconductor devices, such as for example different types of diodes, transistors and thyristors, and it is an attractive technique in device fabrication as it allows control of both impurity level and distribution. This technique is well developed for Si-devices, but the method successfully used for ion implantation for such devices may not be utilized for SiC-devices, which are particularly used in applications in which it is possible to benefit from the superior properties of SiC in comparison with primarily Si, namely the capability of SiC to function well under extreme conditions. SiC has a high thermal stability due to a large bandgap energy, such that devices fabricated from said material are able to operate at high temperatures, namely up to 1000 K. Furthermore, it has a high thermal conductivity, so that SiC-devices may be arranged at a high density. SiC also has more than five times higher breakdown field than Si, so that it is well suited as a material in high power devices operating under conditions where high voltages may occur in the blocking state of the device.

Accordingly, it is highly desired to find means to control this technique of device fabrication also for SiC, so that doped high quality regions with a low defect density may be created in SiC by ion implantation.

When impurity dopants are implanted in SiC very high annealing temperatures, at least above 1300° C., are necessary. During the annealing some type of dopants starts to diffuse into the bulk of said semiconductor layer, which has one positive effect in that the physical pn-junction will be located away from the implanted region in the undisturbed semiconductor layer of SiC. But this outdiffusion at the surface is negative in that it causes very low concentrations of the dopants at the surface and thus it is difficult to form a good ohmic contact on such a device. When on the other hand a dopant which show a very low diffusivity in SiC is implanted the dopant profile remains nearly as implanted after the annealing step, so that a highly doped near surface contact region with a low resistivity will be obtained, but the pn-junction will be located in a depth where a high concentration of defects is formed by the implantation, so that limitations in the breakdown behaviour as well as in emitter efficiency might be expected for such a semiconductor device.

SUMMARY OF THE INVENTION

The object of the present invention is to find a remedy to the inconveniences discussed above by providing a new method of the type defined in the introduction.

This object is in accordance with the invention obtained by providing such a method in which said annealing in step b) is carried out at such a high temperature that at least a portion of said dopants diffuses into the non-implanted sub-layer of said SiC-layer following said near surface layer, and by implanting in step a) first type impurity dopants of at least two different elements in the SiC-layer, at least one of said elements is slowly diffusing in SiC at said annealing temperature for retaining a high doping of said near surface layer after annealing for making it possible to form a good ohmic contact to said semiconductor layer and at least one of said elements is rapidly diffusing in SiC at said annealing temperature for locating a pn-junction so created at a considerable distance from said near surface layer. By this type of combination of two different impurity dopants in an implantation step, it will be possible to benefit from the advantageous characteristic of each of them, so that the slowly diffusing element upon annealing will ensure the possibility to form a good ohmic contact on the semiconductor device, and the rapidly diffusing element will at the same time displace the pn-junction into a depth being at a considerable distance from the region damaged by the implantation, so that the active pn-junction will be located in an area of high crystalline perfection. "Slowly" and "rapidly" are to be interpreted broadly, and they do only state that one of the elements is diffusing with a considerably higher speed than the other at the temperature chosen for the anneal. As known, the diffusion rate is dependent on the temperature, so that it will theoretically be possible to chose one and the same element as the slowly diffusing element at one annealing temperature and as the rapidly diffusing element at a higher annealing temperature.

According to a preferred embodiment of the invention two elements are implanted in said semiconductor layer in step a). The invention is not in any way restricted to the use of exactly two elements, but it will mostly be advantageous for the sake of simplicity to have only two elements.

According to a second preferred embodiment of the invention p-type impurity dopants are implanted in said semiconductor layer in step a). Ion-implantation of p-type dopants into n-type SiC-layer has become a viable way of forming pn-junctions in SiC able to take high reverse bias voltages.

According to another preferred embodiment of the invention said slowly and rapidly diffusing elements implanted in step a) are Group 3 B-elements. The elements belonging to this group have remarkably different diffusitivities in SiC at certain annealing temperatures and there is no problem to implant them as p-type dopants in SiC by ion-implantation, so that the result aimed at may in an advantageous way be achieved selecting these elements for the implantation.

According to a further preferred embodiment of the invention boron is implanted in step a) as said rapidly diffusing element. Boron has a high diffusitivity in SiC and it is therefore well suitable as the element for forming the pn-junction upon annealing of this SiC-layer.

According to another preferred embodiment of the invention aluminium is implanted in step a) as slowly diffusing element. Aluminium is at typical annealing temperatures following the ion-implantation in SiC very slowly diffusing, or nearly not diffusing at all, so that the near surface layer in the SiC-layer is kept highly doped even after the annealing step for allowing the formation of a good ohmic contact to a semiconductor device produced in this way.

Especially the combination of boron as rapidly diffusing element and aluminium as slowly diffusing element has turned out to lead to excellent results with a high concentration of dopants close to the surface of the SiC-layer and a pn-junction located far away from the region damaged by the implantation.

According to another preferred embodiment of the invention said annealing temperature in step b) is selected so as to make a certain implanted impurity dopant one of a) slowly and b) rapidly diffusing in said semiconductor layer of SiC. By using the annealing temperature as a parameter for controlling the diffusion speed different combinations of elements are possible, so that it for instance could be possible to use boron as rapidly diffusing element and beryllium as slowly diffusing element in a method according to the invention, but beryllium as rapidly diffusing element in a method according to another embodiment of the invention using a higher annealing temperature, and in which for instance aluminium or gallium is used as slowly diffusing element. However, the annealing temperature may of course not be arbitrary varied, but it is necessary to select it at least so high that the implanted dopants are efficiently made electrically active by the annealing, and different problems may arise, such as the introduction of unwanted impurities, when the temperature is to high. Generally, the temperature necessary for the activation of the impurity dopants implanted will not be high enough for achieve any real diffusion into the SiC-layer.

According to another preferred embodiment of the invention said annealing step b) is carried out at a temperature above 1300° C. This has turned out to be a temperature level which has to be exceeded for a good annealing result.

According to another preferred embodiment of the invention said annealing step b) is carried out at a temperature above 1650° C. It has turned out that such temperatures are preferred for obtaining a diffusion rate being high enough for elements used as rapidly diffusing elements.

According to another preferred embodiment of the invention at least said slowly diffusing element is in step a) implanted at such a dose that said near surface layer becomes highly doped after said annealing step. This is necessary for allowing the formation of a good ohmic contact on the device.

According to another preferred embodiment of the invention said at least one slowly diffusing element and said at least one rapidly diffusing element are in step a) implanted at such dose that said near surface layer becomes highly doped of both of them before the annealing step is carried out. Such a doping will lead to a good final result.

According to another preferred embodiment of the invention said concentration of dopants in the two previously described embodiments is above $10^{19}$ cm$^{-3}$. Such a concentration is well obtainable and preferred for achieving a good final result after annealing.

Another object of the present invention is to provide a semiconductor device of SiC having a good ohmic contact and a pn-junction located in a region of high crystalline quality, and this object is in accordance with the invention obtained by providing a semiconductor device according to the independent appended device claim. The advantages thereof are the same as discussed for the corresponding method claims.

Further preferred features and advantages of the invention will appear from the following description and the other dependent claims.

BRIEF DESCRIPTION OF THE DRAWING

With reference to the appended drawing, below follows a specific description of a preferred embodiment of the invention cited as an example.

In the drawing.

DETAILED DESCRIPTION OF A PREFERRED EMBODIMENT OF THE INVENTION

Figure 1:
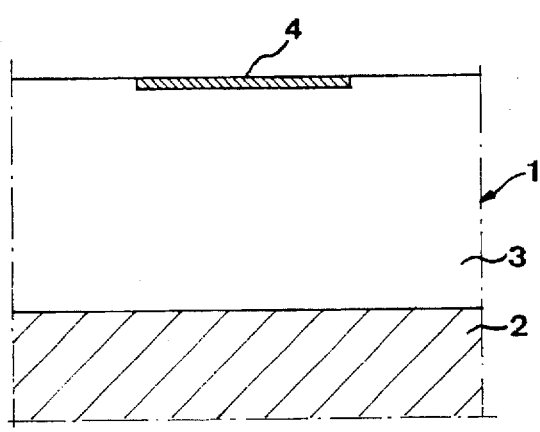
FIG. 1 and 2 illustrate very schematically two subsequent steps in a method for producing a semiconductor device having a semiconductor layer of SiC with at least a pn-junction therein.
Figure 2:
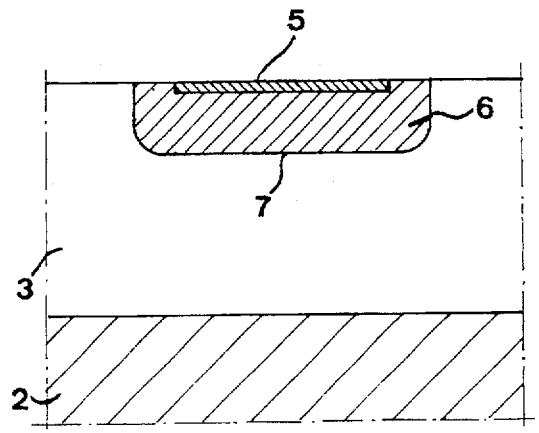

FIG. 1 and 2 illustrate very schematically the two steps of implantation and annealing, respectively, of a method for producing a semiconductor device according to a preferred embodiment of the invention. The method do of course also comprise a lot of other steps conventional in the art, such as masking, demasking, passivation and so on, but these have not been illustrated, since they do not have anything to do with the inventional idea. A semiconductor layer 1 of SiC, preferably of a high crystalline quality, is illustrated in FIG. 1, and this semiconductor layer has a first highly doped n-type layer 2 forming a substrate for a low resistance contact to a cathode and a second low doped n-type layer 3 on top thereof, which is intended to form the drift layer of the device to be produced.

In a step a) the surface of the SiC semiconductor layer 1 is exposed to a bombardment of ions of aluminium and boron. The energy used for the bombardment of said surface by the ions is preferably in the range of 100 KeV–4 MeV. A thin layer 4 having a thickness in the region of 10th of μm with a high concentration of dopants is in this way created. The concentration of aluminium in said thin layer 4 is preferably above $10^{19}$ cm$^{-3}$, whereas the concentration of boron, i.e. the dopant intended to diffuse further into the SiC-layer in a following step, may be lower. These dopants are not electrically active after this implantation step, and the semiconductor layer 1 has to be heated to a temperature above 1300° C. for obtaining such activation of the p-type dopants. If the annealing temperature is selected to be approximately 1700° C. the boron will diffuse rapidly with respect to the aluminium into said SiC-layer 1 during said annealing. This annealing step will result in a thin surface layer 5 having primarily aluminium as p-type dopant and substantially corresponding to said thin layer 4 resulted from the implantation step, and a layer 6 having substantially boron as p-type dopant and extending deeper into the semiconductor layer for forming a pn-junction at a considerable distance from the surface region damaged by the implantation. The layer 6 will have a lower doping concentration than the layer 5, which thanks to the high doping concentration thereof will make it possible to form an excellent ohmic contact to the device there. In this way a rectifier diode has been produced; and the space charge region thereof is primarily provide by said second low-doped layer 3, which will take the main part of the voltage applied on the device in the reverse operating direction thereof, and such a device may have a breakdown voltage in the kV-range.

The graphs in FIG. 3–6 explains how the advantageous semiconductor device shown in FIG. 2 can be obtained through the steps of the method according to the invention described above. The horizontal axis in these figures indicates the depth and the vertical axis the logarithm of the concentration of the respective dopants. It is assumed that the same annealing temperature is used for all the examples according to FIG. 3–6.

Figure 3:
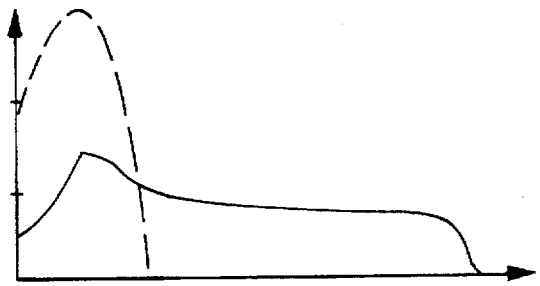
FIG. 3 and 4 are graphs illustrating the concentration (the logarithm thereof) of boron and aluminium, respectively, as a function of the depth in the SiC-layer into which they have been implanted before (dashed lines) and after (full lines) annealing.

In FIG. 3 it is shown by dashed lines how boron will be present in the semiconductor layer 1 as a function of the depth after implantation, and the full line shows the distribution of boron after the annealing step. Thus, boron diffuses comparatively far into said SiC-layer during the annealing step leaving only a comparatively small concentration thereof in the near surface region.

Figure 4:
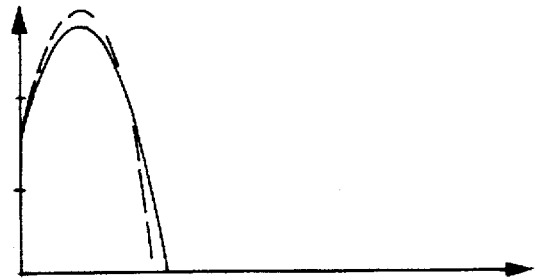

FIG. 4 shows the distribution of aluminium as implanted (dashed line) and after the annealing (full line). Accordingly, aluminium is nearly not diffusing into the SiC-layer at all during said annealing step at the annealing temperature selected, so that the high concentration of aluminium remains near the surface after said annealing step.

Figure 5:
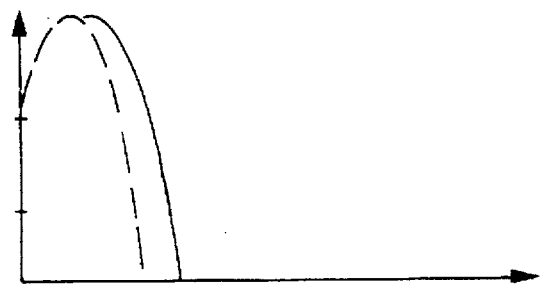
FIG. 5 is a graph corresponding to those of FIG. 3 and 4 but showing the concentration of aluminium (dashed line) and boron (full line) as a function of the depth as implanted.
Figure 6:
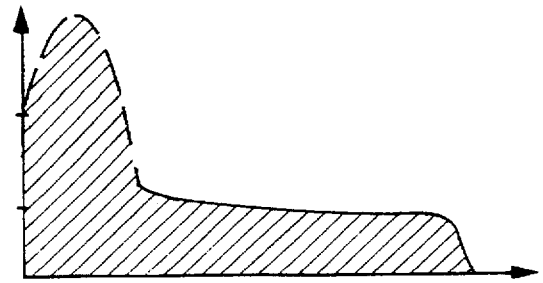
FIG. 6 is a graph of the concentration of aluminium (dashed line) and boron (full line) as a function of the depth after carrying out the annealing step.

FIG. 5 shows the distribution of boron (full line) and aluminium (dashed line) after the implantation step of the method according to the invention, and FIG. 6 shows the distribution of boron (full line) and aluminium (dashed line) after the annealing step of said method. Thus, FIG. 6 illustrates clearly how a high concentration of dopants in the near surface layer for a good ohmic contact is combined with a pn-junction located comparatively deep in the undisturbed bulk of a high crystalline perfection by the implantation and annealing step of the method according to the invention.

It is emphasized that the graphs according to FIG. 3–6 may have a similar appearance for other impurity dopants than aluminium and boron, and the invention is not only restricted to p-type dopants, but also n-type dopants are conceivable.

The invention is of course not in any way restricted to the preferred embodiment described above, but many possibilities to modifications thereof would be apparent to a man with ordinary skill in the art without departing from the basic idea of the invention.

In the implantation step it will be possible to implant the different elements simultaneously, but it would also be possible to first implant one of them and then the other.

That the semiconductor device produced has a semiconductor layer of SiC does not necessarily mean that the semiconductor device has SiC as the only semiconductor material, but only the region in which the implantation takes place and in which a pn-junction is formed by the diffusion has to be of SiC and the device may have hetero-character should this be desired.

The definition "semiconductor layer of SiC" includes that this SiC-layer may consists of several sub-layers as shown in the figures. Furthermore, the definition "layer" is to be interpreted broadly and comprises all types of volume extensions and shapes.

All definitions concerning the material of different layers of course also include inevitable impurities as well as intentional doping when SiC is concerned.

I claim:

1. A method for producing a semiconductor device having a semiconductor layer of SiC with at least a pn-junction therein, comprising the steps of:
   a) implanting an impurity dopant of a first conductivity type, into said semiconductor layer being doped according to a second opposite conductivity type for forming a first type doped near surface layer in said semiconductor layer and
   b) annealing said semiconductor layer at a high temperature for making the implanted impurity dopants electrically active, wherein in step b) said annealing is carried out at such a high temperature that at least a portion of said dopants diffuses into the non-implanted sub-layer of said semiconductor layer following said near surface layer, and wherein in step a) first conductivity type impurity dopants of at least two different elements are implanted in the semiconductor layer and wherein at least one of said elements is slowly diffusing in SiC at said annealing temperature for retaining a high doping of said near surface layer after annealing to form a good ohmic contact to said semiconductor layer and at least one of said elements is rapidly diffusing in SiC at said annealing temperature for locating a pn junction so created at a considerable distance from said near surface layer.

2. A method according to claim 1, wherein first conductivity type impurity dopants of two different elements are implanted in said semiconductor layer in step a).

3. A method according to claim 1 wherein p-type impurity dopants are implanted in said semiconductor layer in step a).

4. A method according to claim 1, wherein said slowly and rapidly diffusing elements implanted in step a) are Group 3B-elements.

5. A method according to claim 3 wherein boron is implanted in step a) as said rapidly diffusing element.

6. A method according to claim 3, wherein beryllium is implanted in step a) as said rapidly diffusing element.

7. A method according to claim 3 wherein aluminum is implanted in step a) as said slowly diffusing element.

8. A method according to claim 3, wherein gallium is implanted in step a) as said slowly diffusing element.

9. A method according to claim 1, wherein said annealing temperature in step b) is selected so as to make a certain implanted impurity dopant one of slowly and rapidly diffusing in said semiconductor layer of SiC.

10. A method according to claim 1, wherein said annealing in step b) is carried out at a temperature above 1300° C.

11. A method according to claim 1, wherein said annealing in step b) is carried out at a temperature above 1650° C.

12. A method according to claim 1, wherein at least said slowly diffusing element is in step a) implanted at such a dose that said near surface layer becomes highly doped after said annealing step.

13. A method according to claim 1, wherein both said at least one slowly diffusing element and said at least one rapidly diffusing element are in step a) implanted at such a dose that said near surface layer becomes highly doped of both of them before the annealing step is carried out.

14. A method according to claim 12 wherein said dose corresponds to a concentration above $10^{19}$ $cm^{-3}$.

* * * * *